(12) United States Patent
Cheng et al.

(10) Patent No.: US 9,589,785 B2
(45) Date of Patent: Mar. 7, 2017

(54) CLEANING METHOD AND COMPOSITION IN PHOTOLITHOGRAPHY

(71) Applicant: Taiwan Semiconductor Manufacturing Company, Ltd., Hsin-Chu (TW)

(72) Inventors: Ya-Ling Cheng, Yilan County (TW); Chien-Wei Wang, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/471,738

(22) Filed: Aug. 28, 2014

(65) Prior Publication Data

US 2016/0059272 A1    Mar. 3, 2016

(51) Int. Cl.
*H01L 21/02* (2006.01)
*B08B 3/10* (2006.01)
*C11D 11/00* (2006.01)
*G03F 1/00* (2012.01)

(52) U.S. Cl.
CPC .......... *H01L 21/02041* (2013.01); *B08B 3/10* (2013.01); *C11D 11/0047* (2013.01); *G03F 1/00* (2013.01)

(58) Field of Classification Search
CPC ............ H01L 29/7869; H01L 2924/00; H01L 27/1214; H01L 27/1225; H01L 27/1292; H01L 21/02; H01L 21/02041; H01L 21/02068; H01L 21/67023; H01L 21/76814; H01L 21/4828; B08B 3/08
USPC ......................... 438/158, 127, 626, 631, 633
See application file for complete search history.

(56) References Cited

U.S. PATENT DOCUMENTS

| | | | |
|---|---|---|---|
| 2008/0299780 A1* | 12/2008 | Elliott et al. ................. | 438/770 |
| 2010/0224215 A1* | 9/2010 | Mertens ............ | H01L 21/02071 134/6 |
| 2012/0184071 A1* | 7/2012 | Kon ............................ | 438/127 |

* cited by examiner

*Primary Examiner* — Julio J Maldonado
*Assistant Examiner* — Rodolfo D Fortich
(74) *Attorney, Agent, or Firm* — Haynes and Boone, LLP

(57) ABSTRACT

The present disclosure provides one embodiment of a method. The method includes applying a first cleaning fluid to a substrate, thereby cleaning the substrate and forming a protection layer on the substrate; and applying a removing process to the substrate, thereby removing the protection layer from the substrate. The first cleaning fluid includes a cleaning chemical, a protection additive and a solvent.

20 Claims, 7 Drawing Sheets

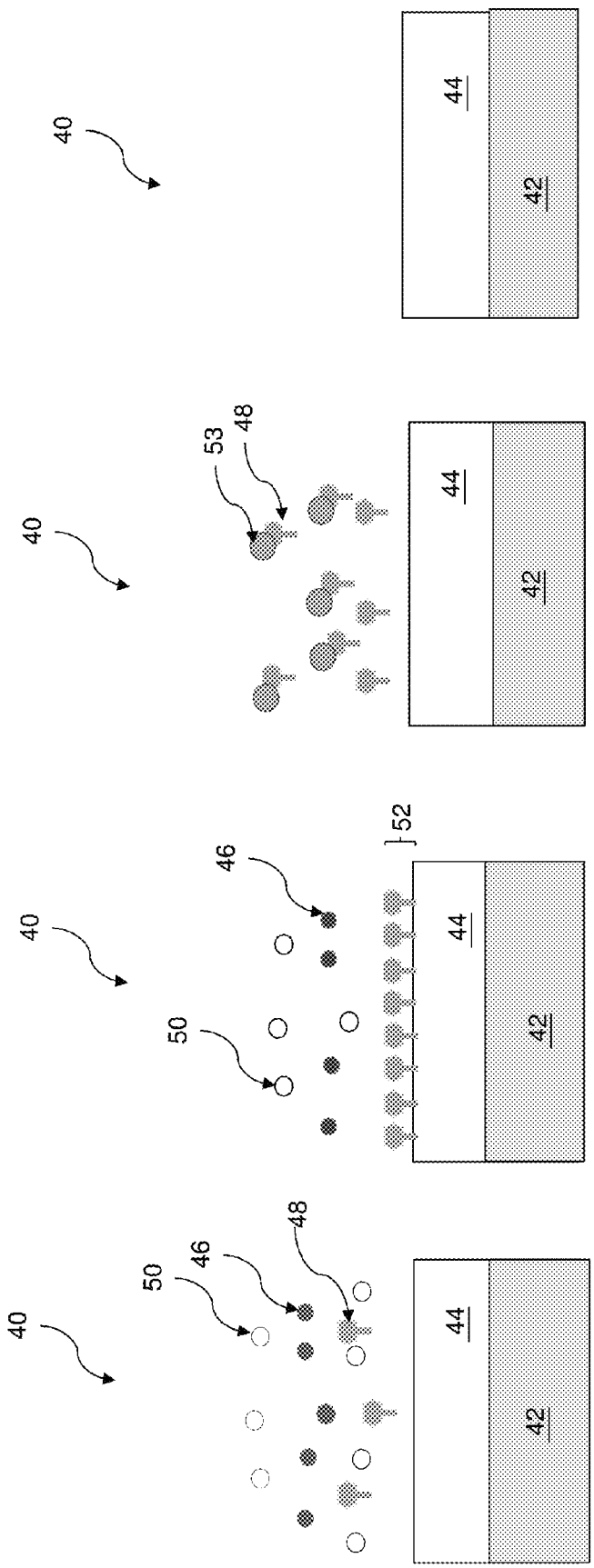

US 9,589,785 B2

CLEANING METHOD AND COMPOSITION IN PHOTOLITHOGRAPHY

BACKGROUND

In semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

A photolithography process forms patterned resist layer for various patterning processes, such as etching or ion implantation. In the photolithography process, a photomask (or mask) is used. The mask includes a substrate and a patterned layer that defines an integrated circuit to be transferred to a semiconductor substrate during the photolithography process. During the formation of the mask or the photolithography process utilizing the mask, various mask contaminants, such as chemical contaminants, are introduced and are hard to remove. The current cleaning methods do not efficiently remove the mask contaminants and may further damage the mask. Therefore, what is needed is a method and cleaning materials to address the above issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A through 4D are sectional views of a substrate constructed in accordance with some embodiments.

DETAILED DESCRIPTION

Figure 1:
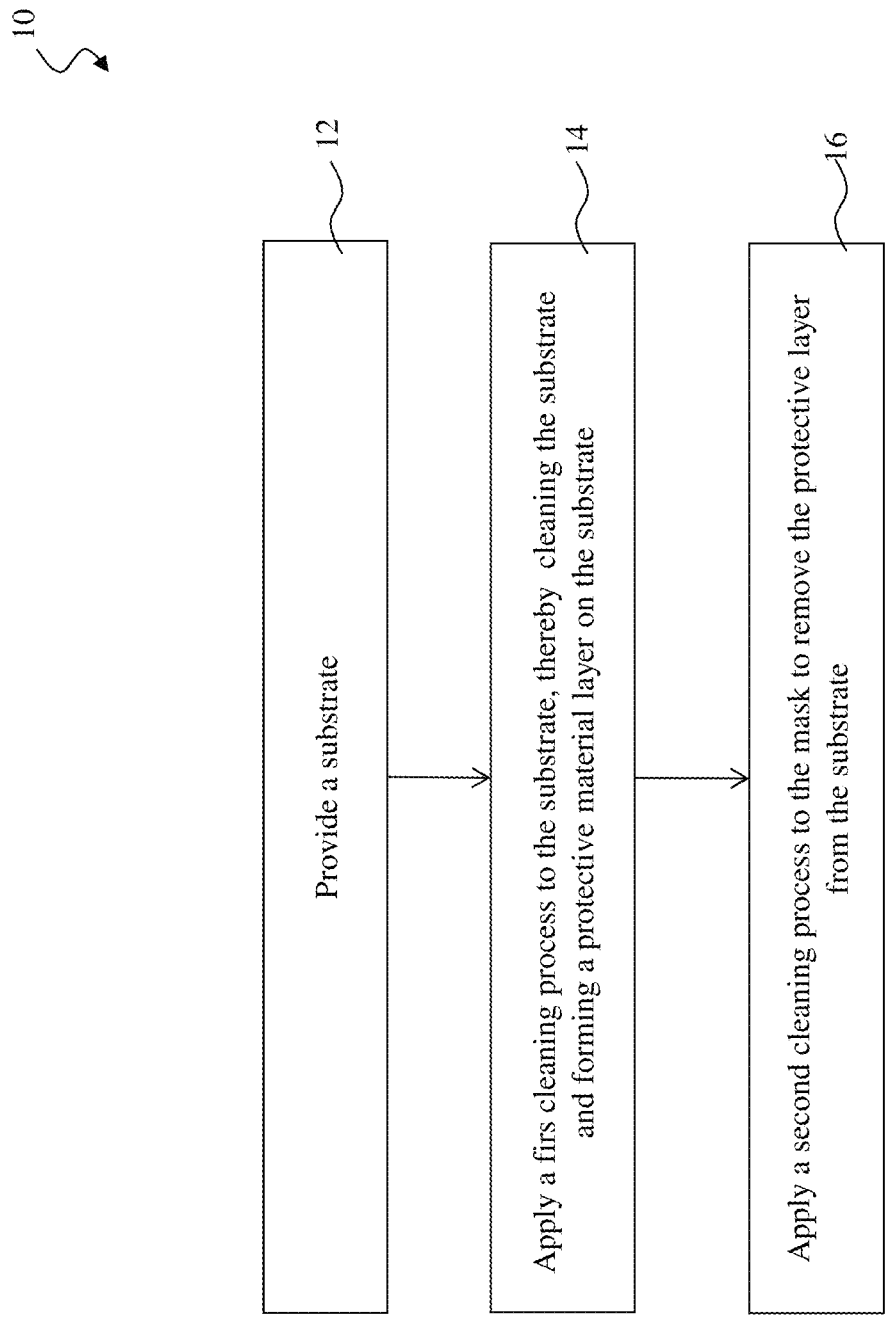
FIG. 1 is a flowchart of a method constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring to FIG. 1, a method 10 is used to clean a substrate in semiconductor fabrication in accordance with some embodiments. The method 10 begins at an operation 12 by providing a substrate to be cleaned. In some embodiments, the substrate is a photomask that can be used in a photolithography process to fabricate semiconductor wafers and the like. The photomask is also referred to as a mask or reticle.

Figure 2:
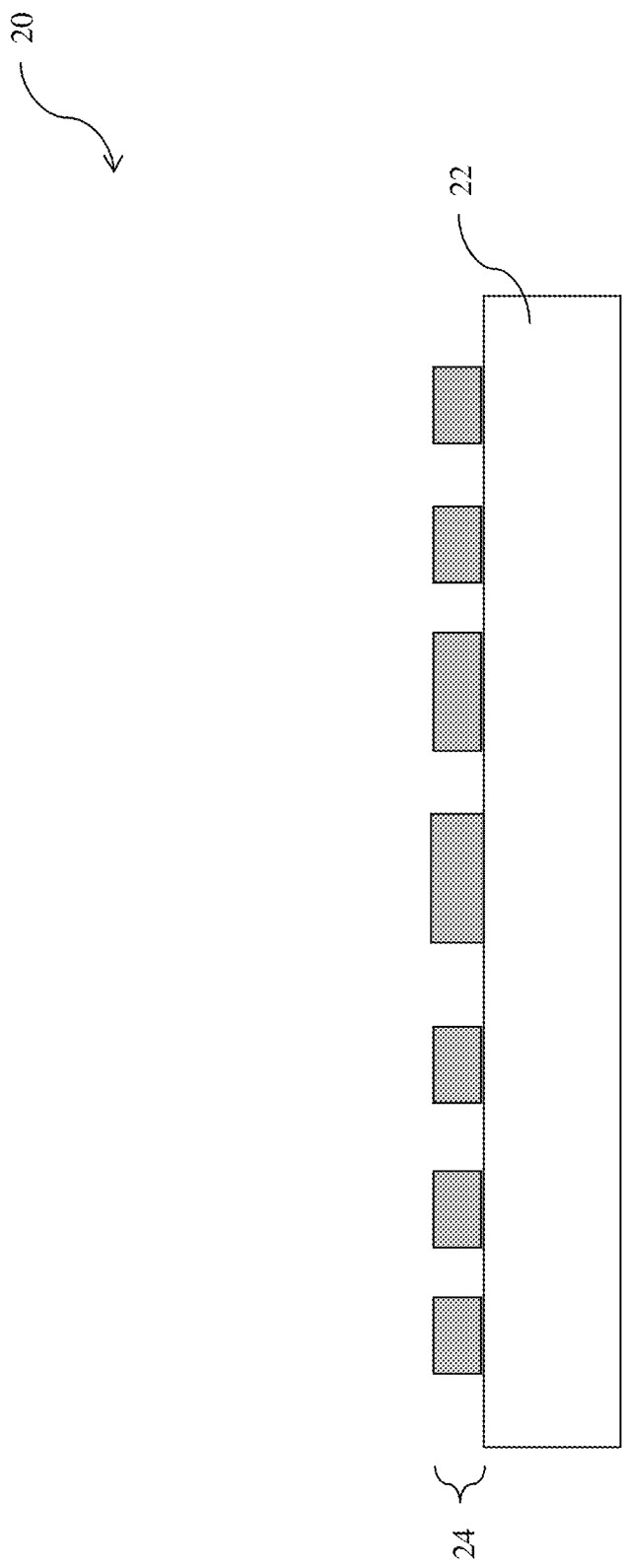
FIG. 2 is a sectional view of a mask constructed in accordance with some embodiments.

FIG. 2 illustrates an exemplary mask 20 in accordance with some embodiments. The mask 20 is a transmissive mask. The mask 20 includes a transparent substrate 22 having fused quartz ($SiO_2$), calcium fluoride ($CaF_2$), or other suitable material. The mask further includes an absorption layer 24 formed on the transparent substrate and patterned to define an integrated circuit pattern. The absorption layer 24 includes chromium (Cr) and/or MoSi. In various embodiments, the absorption layer 24 may alternatively include Cr, MoSi, iron oxide, or an inorganic film made with MoSi, ZrSiO, SiN, $MoSiON_x$, and/or TiN. The absorption layer may have a multilayer structure. For example, the absorption layer may include a layer of Cr film and a layer of MoSi film. The mask may further include patterned features (shifters) formed on/in the substrate to phase-shift a radiation beam passing therethrough. In one embodiment, the shifters may include areas in which the substrate is partially etched such that the radiation beam through these areas has a predefined phase shift, such as about a 180 degree shift relative to areas not etched. In another embodiment, the shifters may be integrated with the absorption layer. For example, a MoSiON layer may be coated on the substrate to provide partial absorption and a phase shift to a radiation beam. However, MoSiON material is sensitive to base-containing solutions and can be damaged during a conventional cleaning process, resulting in further defects on the mask.

Figure 3:
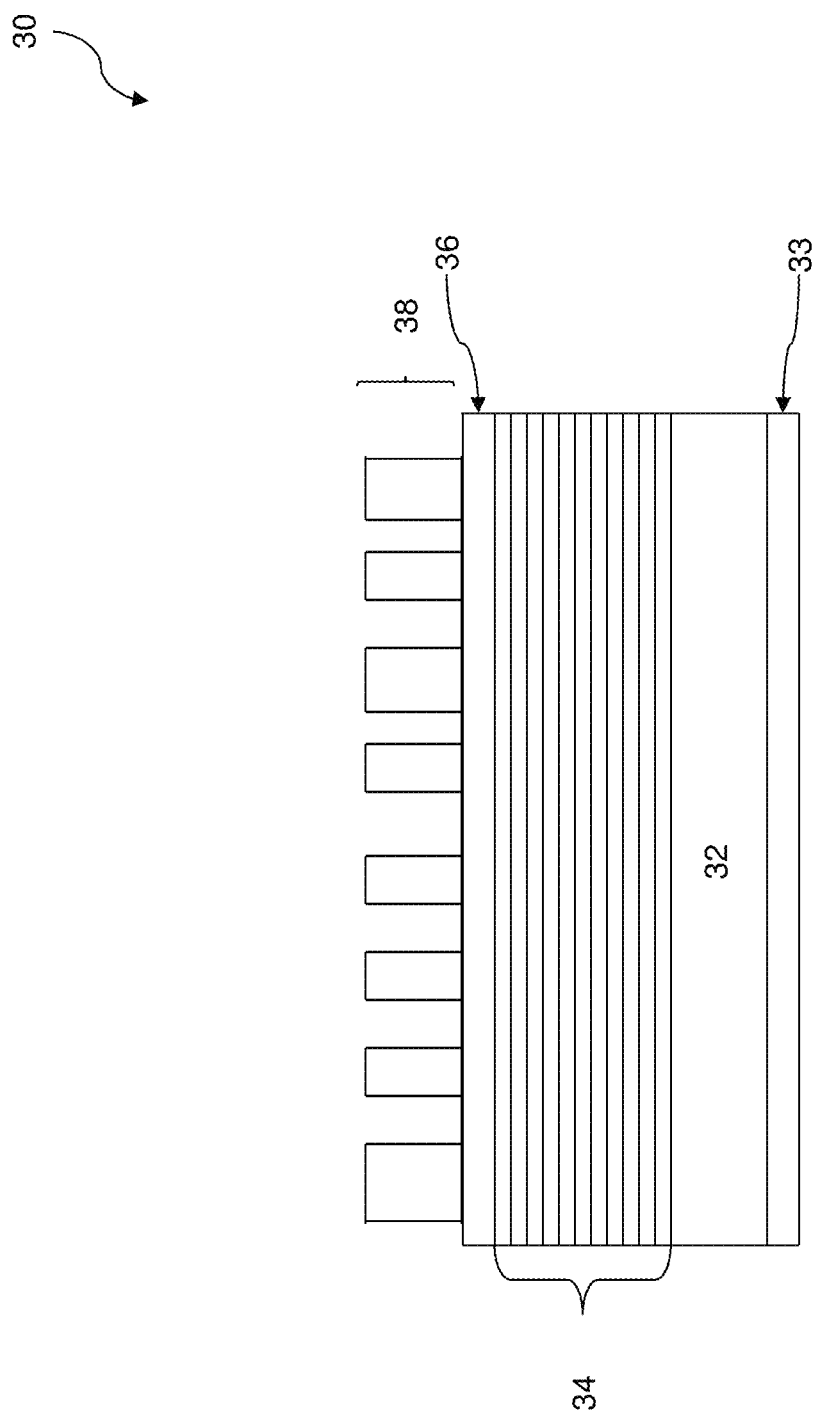
FIG. 3 is a sectional view of a mask constructed in accordance with some embodiments.

FIG. 3 illustrates another exemplary mask 30 in accordance with some embodiments. The mask 30 is reflective mask used in an extreme ultraviolet (EUV) lithography process and a EUV lithography system. The EUV lithography system has a light source to generate EUV light, such as EUV light having a wavelength centered at about 13.5 nm. The mask 30 includes a substrate 32 made of a low thermal expansion material (LTEM). The LTEM material may include TiO2 doped SiO2, or other material having low thermal expansion. The LTEM substrate 32 serves to minimize image distortion due to mask heating. In some embodiments, a conductive layer 33 is disposed on back surface of the LTEM substrate 32 for the electrostatic chucking purpose. In an embodiment, the conductive layer 33 includes chromium nitride (CrN), or other suitable conductive material.

A reflective multilayer (ML) 34 is deposited over the LTEM substrate 32 from the front surface. The ML 34 includes a plurality of film pairs, such as molybdenum-silicon (Mo/Si) film pairs (e.g., a layer of molybdenum above or below a layer of silicon in each film pair). Alternatively, the ML 34 may include molybdenum-beryllium (Mo/Be) film pairs, or any material that is highly reflective at EUV wavelengths can be utilized for the ML 34. In some embodiments, the number of film pairs ranges from 20 to 80. A capping (or buffer) layer 36 may be formed above the ML 34 for one or more functions, such as etch stopping, preventing oxidation of the ML. The capping layer 36 may include one or more films to achieve the intended functions. In one example, the buffer layer 36 includes ruthenium (Ru). In other examples, the capping layer 36 may include Ru compounds such as RuB, RuSi, chromium (Cr), Cr oxide, or Cr nitride.

The mask 30 includes a material layer 38 patterned according an IC pattern. In some embodiment, the material layer 38 is an absorption layer, such as a tantalum boron nitride (TaBN) layer or other suitable material, deposited over the ML 34. Alternatively, the material layer 38 includes another reflective layer patterned to define an IC pattern, thereby forming a EUV phase shift mask.

The above embodiments of the mask are for illustration. Other types of mask are not excluded. In various embodiments, the mask may be a binary mask, phase shift mask, or multi-tone mask. As the IC pattern formed on a mask has smaller feature sizes, the mask is more sensitive to contamination and damages caused by a cleaning process. Furthermore, as the configurations and compositions of the material stack in the mask are diversified, a proper cleaning method to effectively clean various materials of the mask but without damaging them is desired. The disclosed method 10 and compositions addresses those.

Even though the mask is employed as an example to illustrate the disclosed method and system, it is not limited to a mask and may be extended to cleaning other substrates having similar contamination issues. In some other embodiments, the substrate is a semiconductor wafer, such as a silicon wafer or a wafer having some other semiconductor material, such as germanium, silicon germanium gallium arsenic, silicon carbide or a combination thereof. In one example, the substrate includes a sapphire wafer having gallium arsenic and/or other semiconductor material formed thereon. In another example, the substrate includes a silicon wafer having epitaxy grown silicon germanium. In yet another example, the substrate includes a silicon wafer having silicon germanium and silicon carbide locally epitaxy grown on source/drain regions or channel regions. In furtherance of the embodiments, the semiconductor wafer further includes one or more material layer patterned or to be patterned to form various circuit features, such as a semiconductor material layer, a dielectric material, or a conductive material.

The method 10 may include various fabrication processes applied to the substrate. Contaminations could be introduced to the substrate. In some embodiments, the method 10 includes applying a photolithography patterning process to the substrate. A photolithography patterning process is designed to form a patterned resist layer and includes resist coating, exposure, developing and various baking steps in some embodiments. The substrate may further be patterned (by etching or ion implantation for examples) using the patterned resist layer as an etching (or implantation) soft-mask to transfer an IC pattern from the resist layer to an underlying material layer. In various embodiments, the photolithography patterning process includes ultraviolet (UV) lithography, deep ultraviolet (DUV) lithography or extreme ultraviolet (EUV) lithography. For example, the radiation source of the lithography system may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; or other light sources having a desired wavelength.

FIGS. 4A-4D illustrates a sectional view of an exemplary substrate 40 at various fabrication stages, constructed in accordance with some embodiments. The first operations of the method 10 of FIG. 1 are discussed below with reference to FIG. 4A, and the other operations of the method 10 are described with reference to FIGS. 4B-4D. In some embodiments, the substrate 40 is a mask 42 having a material layer 44 to be cleaned. In some examples, the material layer 44 includes chromium or quartz on a transmissive mask. In some examples, the material layer 44 includes a reflective ML or a TaBN layer in a EUV reflective mask. In some embodiments, the substrate 40 is a semiconductor wafer 42 with a material layer 44 to be cleaned. In furtherance of the embodiments, the material layer 44 may include a semiconductor material (such as silicon, or gallium arsenic), a dielectric material (such as silicon oxide, silicon nitride, or low k dielectric material), or a conductive material (such as doped polysilicon or aluminum). In some embodiments, the material layer 44 is a top portion of a mask or a semiconductor wafer. For example, the material layer 44 is a top silicon portion of a silicon wafer. Various contaminations may be introduced during those processes and need to be removed.

As one example, the material layer 44 may be contaminated in the photolithography patterning process, by the outgassing of resists during the exposure, falling-on particles, and/or chemical pollutants from the environment (such as NH3, SO2, COOH, and organic contaminate, for examples). In the conventional mask cleaning process, the cleaning chemicals and aqueous solution react with the material layer 44, inducing the damages to the material layer 44. In a more particular example, the substrate 40 is a EUV mask and the material layer 44 is a capping layer of Ru. The existing cleaning chemical includes an aqueous solution that causes Ru to be oxidized and introduces cracking in the Ru capping layer.

Referring back to FIG. 1, the method 10 proceeds to an operation 14 by applying a first cleaning process to the substrate 40, thereby cleaning the substrate and forming a protective material layer on the substrate 40. Particularly, the first cleaning process effectively cleans a surface of the substrate 40 and simultaneously forms a protective material layer on the surface during the first cleaning process. The protective material layer is capable of effectively protecting the substrate 40 from damages. In the present embodiment, the operation 14 is applied to the material layer 44. During the first cleaning process, the top surface of the material layer 44 is cleaned and is protected by the protective material layer.

The first cleaning process includes applying a first cleaning fluid to the substrate 40. In some embodiments, the first cleaning fluid is applied to the substrate 40 by spin-on process or a suitable process. For example, the first cleaning fluid is delivered to the substrate 40 by a spray nozzle or other suitable mechanism while the substrate 40 simultaneously spins for uniform cleaning effect.

In the present embodiment, the first cleaning fluid is a solution that includes a cleaning chemical 46, a protection additive 48 and a solvent 50. The cleaning chemical 46 is capable of effectively removing the contaminant from the substrate 40. In some embodiments, the cleaning chemical 46 is chosen and designed to remove the contaminant by chemical force, such as oxidation/reduction reaction, acid/base reaction, substitution or addition reaction. In some embodiments, the cleaning chemical 46 is chosen and designed to remove the contaminant by physical force, such as columbic force or magnetic force. In some embodiments, the cleaning chemical 46 includes $O_3$, surfactant, $CO_2$, organic acid, inorganic acid, organic base, inorganic base, $H_2O_2$, or a combination thereof. In some embodiments, the weight percentage of the cleaning chemical 46 in the first cleaning fluid ranges from about 0.01% to about 50%. In some embodiments, the solvent 50 includes water ($H_2O$) with volume concentration greater than 50%. In some embodiments, the solvent 50 includes $H_2O_2$ and further includes at least one organic solvent. In some examples, the organic solvent includes at least one of alcohol and ether.

In some embodiments, the protection additive 48 includes a linking unit (L), a space unit (R), and protection unit (Z) chemically bonded together. In the present embodiment, the linking unit L and the protection unit Z are directly boned to the space unit R. The linking unit L is capable of attaching to the substrate 40 by chemical and/or physical force. The protection unit Z is capable of protecting the substrate 40 from damaging. The space unit is a structure to provide proper spatial adjustment when the protection layer is formed. In some embodiments, the space unit is eliminated. In some other embodiments, the linking unit and the protection unit are combined so that one chemical group has both functions.

Figure 5A:
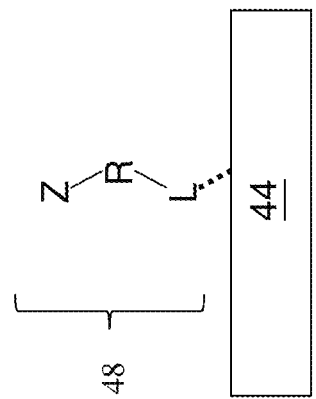
FIGS. 5A through 5C are diagrammatic top views of a protection additive, constructed in accordance with some embodiments.
Figure 5B:
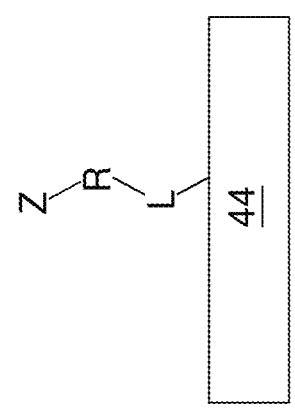
Figure 5C:
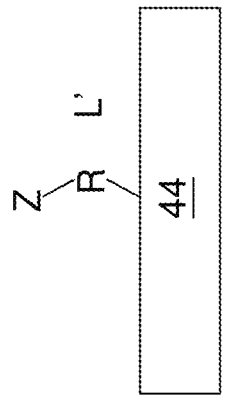

The attachment of the protection additive to the top surface of the substrate 40 is further described with reference to FIGS. 5A-5C. In some embodiments, as illustrated in FIG. 5A, the protection additive 48 is capable of being attached to the substrate 40, particularly the top surface of the material layer 44, by physical force, such as columbic force or magnetic force. In some embodiments, as illustrated in FIGS. 5B-5C, the protection additive 48 is capable of being attached to the substrate 40, particularly the top surface of the material layer 44, by chemical force, such as oxidation/reduction reaction, or acid/base reaction, substitution or addition reaction.

In some embodiments, the protection unit Z is a substituted or unsubstitued, straight or branched C1-C20 alkyl, alkenyl or oxoalkyl group or a substituted or unsubstitued C6-C19 aryl, aralkyl or aryloxoaclkyl group or hydrogen, C1-C15 fluoroalkyl or fluoroalcohol-containing group. A C1-C20 alkyl represents an alkyl having 1-20 carbons. A C6-C19 aryl has a similar representation.

In some embodiments, the space unit R is a substituted or unsubstitued, straight or branched C1-C20 alkyl, alkenyl or oxoalkyl group or a substituted or unsubstitued C6-C19 aryl, aralkyl or aryloxoaclkyl group or hydrogen. In some embodiments, the linking unit L is common lewis base. Its function group includes but is not limited to I—, Br—, F—, Cl—, $NO_3$—, S2—, SCN—, OH—, $C_2O_4$2—, $H_2O$, NCS—, $NH_3$, alkenyl, $SO_3$2—, phenol, $NO_2$—, CO, or CN.

In some embodiments, the protection unit includes a hydrophobic group. In some embodiments, the hydrophobic group includes at least one of hydrogen (H), an unbranched or branched, cyclic or noncyclic saturated or unsaturated alkyl or alkenyl or alkynyl groups, an unbranched or branched, cyclic or noncyclic saturated or unsaturated fluoroalkyl or fluoroalkenyl or fluoroalkynyl groups. In some embodiments, the space unit The R comprise unbranched or branched, cyclic or noncyclic saturated or unsaturated alkyl or alkenyl or alkynyl groups with the carbon number 1~20. In some examples, the protection additive is selected from but no limited to, octaethylene glycol monododecyl ether, pentaethylene glycol monododecyl ether, perfluorooctanesulfonate, perfluorononanoate, perfluorooctanoate or the like.

During the operation 14, the first cleaning fluid is applied to the substrate 40. The cleaning chemical 46 removes the contaminant (as illustrated in FIG. 4A) and the protection additive 48 is attached or absorbed to the substrate 40 to form a protection material layer 52 (as illustrated in FIG. 4B). In some embodiments, the first cleaning fluid is further heated to a suitable higher temperature to enhance the removal of the contaminant prior to its application.

Back to FIG. 1, the method 10 proceeds to an operation 16 by applying a second cleaning process to remove the protective layer. In some embodiments, the second cleaning process includes one of a thermal treatment, an electric treatment, an acoustic treatment, a magnetic treatment, an actinic treatment or a chemical treatment.

In some embodiments, a thermal treatment process heats the substrate 40 to a high temperature, ranging from about 150° C. to about 350° C., for example. The thermal treatment is implemented by a mechanism similar to a rapid thermal annealing (RTA), or other proper heating mechanism. For example, the thermal process may be carried out by a heat diffusion device. In one embodiment, the thermal treatment is performed in a vacuum environment. In another embodiment, the thermal treatment is combined with a gas injection. The temperature range of the thermal treatment may be larger while maintaining proper efficiency when the gas injection is implemented in parallel.

In some embodiments, the operation 16 also includes an irradiation treatment to the substrate. In various embodiments, the irradiation treatment may use a laser irradiation treatment, and/or ultra-violet (UV) irradiation treatment. In one example, the irradiation treatment includes UV irradiation with a wavelength ranging between about 157 nm and about 257 nm. In another example, the irradiation treatment includes a treatment duration ranging from about 10 minutes to about 2 hours. In a further example, a 172-nm Osram lamp may be used for this purpose. The irradiation treatment may be performed in a vacuum environment such as a vacuum chamber. The vacuum chamber can be pumped to a pressure lower than $10^{-3}$ torr before applying the irradiation treatment. During the irradiation treatment, the substrate is secured by a face-down chuck configured such that particle dropping to the mask or the chuck is prevented. In one exemplary experiment with about 2000 joules irradiation, chemical residue is decomposed and then removed. In another embodiment, the gas injection process is combined with the irradiation treatment such that both processes are implemented in parallel.

In some embodiments, the chemical treatment is applied to the substrate 40 to remove the protection material layer 52 and includes applying a second cleaning fluid to the substrate 40. In some embodiments, the second cleaning fluid includes an organic solvent or co-solvent.

Figure 6A:
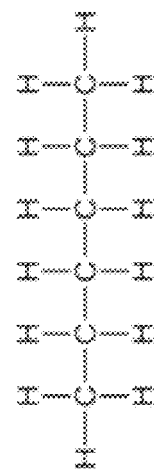
FIGS. 6A through 6C illustrate chemical structures in a cleaning fluid, constructed in accordance with some embodiments.
Figure 6B:
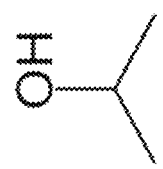
Figure 6C:
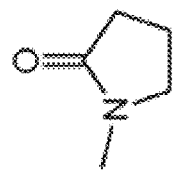

In some embodiments, the second cleaning fluid 53 includes at least one of hexane 54 as illustrated in FIG. 6A, isopropyl alcohol (IPA) 56 as illustrated in FIG. 6B, and N-Methylpyrrolidone (N-methyl-2-pyrrolidine or NMP) 58 as illustrated in FIG. 6C. Hexane 54 is able to effectively bond with the protection additive 48 by Van Der Waal force. IPA 56 is able to effectively bond with the protection additive 48 by hydrogen bonding force. NMP 58 is able to effectively bond with the protection additive 48 by polar force. The second cleaning fluid 53 bonds with the protection additive 48 and removes the protection additive 48, as illustrated in FIG. 4C.

In some embodiments, the second cleaning fluid includes isopropyl alcohol (IPA) and H2O. In furtherance of the embodiments, the volume concentration of each component is no less than 15% and no greater than 60%. For example, the second cleaning fluid includes IPA with a volume concentration ranging from about 15% to about 60% and H2O with a volume concentration ranging from about 15% to about 60%.

In some embodiments, the second cleaning fluid includes IPA and NMP. In furtherance of the embodiments, the volume concentration of each component is no less than 15% and no greater than 60%. For example, the second cleaning fluid includes IPA with a volume concentration ranging from about 15% to about 60% and NMP with a volume concentration ranging from about 15% to about 60%.

In some embodiments, the second cleaning fluid includes IPA, NMP and hexane. In furtherance of the embodiments, the volume concentration of each component is no less than 15% and no greater than 60%. For example, the second cleaning fluid includes IPA with a volume concentration ranging from about 15% to about 60%, NMP with a volume concentration ranging from about 15% to about 60%, and hexane with a volume concentration ranging from about 15% to about 60%. In furtherance of the example, the temperature of the second cleaning fluid is controlled to a temperature between about 5°C. and about 80°C.

In some embodiments, the second cleaning fluid includes a solvent that is a polar solvent, a non-polar solvent or a mixture thereof. A polar solvent is a solvent with polar groups, which are selected from but not limited to, hydroxyl group (—OH), carbonyl group(C═O), ether (R—O—R'), esters (RCOOR'), amine (R—NH2), amides (R—COHN2), carboxylic (—COOH) and so on. In some examples, a polar solvent is selected from but not limited to, propyl ether, ethyl ether, butyl acetate, ethyl acetate, methyl ethyl ketone, acetone, aniline, cyclohexanone, propylene glycol monomethyl ether (PGME), isopropyl alcohol (IPA), N-Methylprrolidone (NMP) and the like. A non-polar solvent is a solvent with non-polar groups, which are selected but not limited to, alkanes (R—H), cyclic alkanes, branch alkanes, aromatics (Ar—H), alkyl halides (R—X) and so on. In some examples, a non-polar solvent could be selected but not limited to, pentane, octane, hexane, cyclohexane, isooctane, trimethylpentane, heptane, toluene, xylene, benzene and the like.

After the operation 16, the substrate 40 is cleaned without damage, as illustrated in FIG. 4D. Additional operations may be implemented before, during, and after the method 10.

Figure 7:
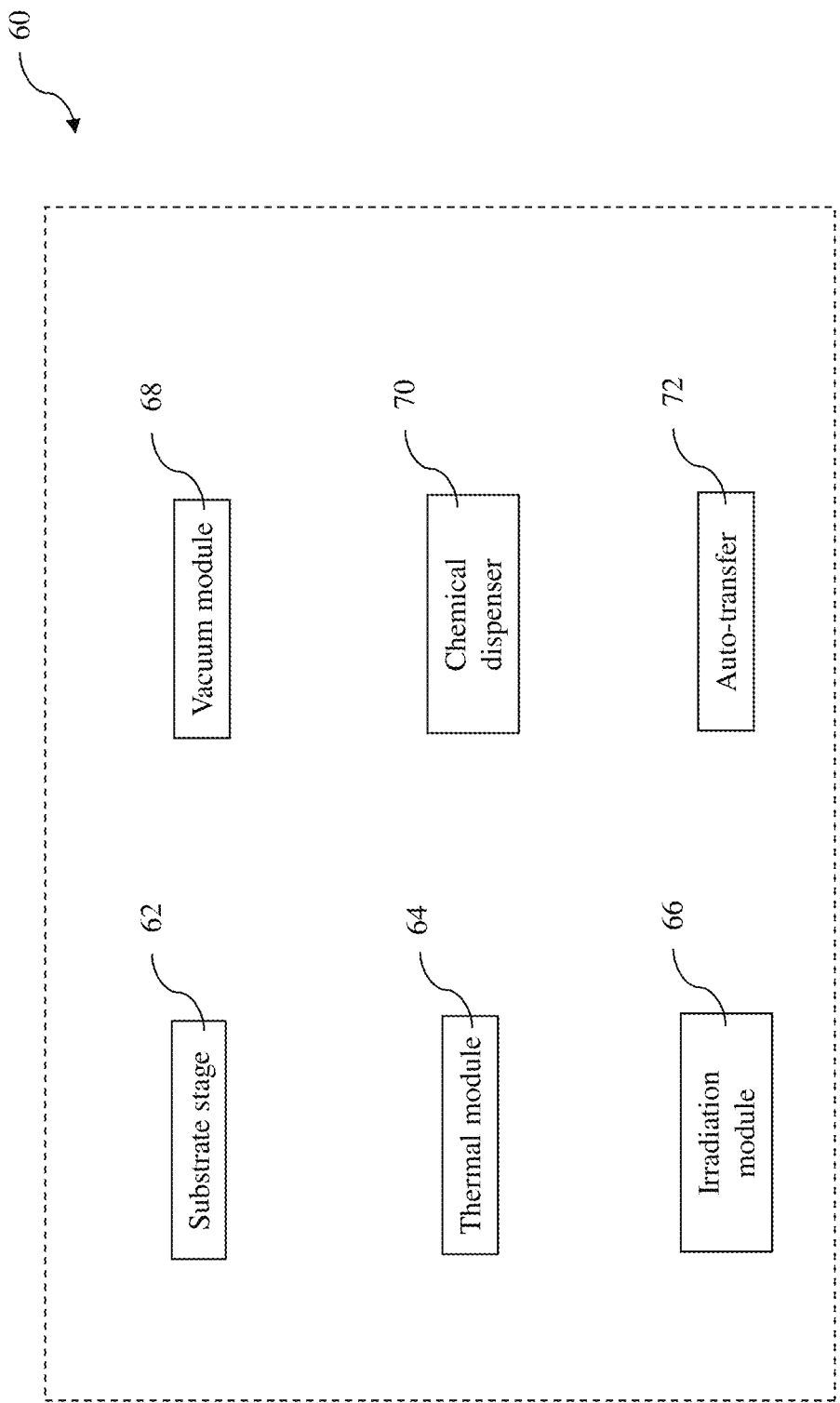
FIG. 7 is a block diagram of a cleaning system in accordance with some embodiments.

FIG. 7 is a block diagram illustrating an exemplary system 60 designed to implement the cleaning method 10 of FIG. 1. The system 60 includes a substrate stage 62 which may to secure the substrate 40 in a configuration such that the top surface of the substrate is operable to receive a cleaning fluid. For example, the substrate 40 is secured in a face-down configuration to prevent particle re-deposition to the substrate. In one embodiment, the system 60 includes more than one substrate stage integrated with various modules of the system. The substrate 40 is transferred among the various modules and secured by a substrate stage embedded in each module to perform a proper cleaning process in each module.

The system 60 includes a thermal module 64 designed for applying a thermal treatment to the substrate. In one embodiment, the thermal module 64 may include a heating structure similar to an RTA tool. In another embodiment, the thermal module 64 includes a hot plate. In another embodiment, the thermal module includes a heat diffusion device or the like. The thermal module may further include thermal sensors configured for proper temperature control during a thermal treatment.

The system 60 includes an irradiation module 66 designed to perform an irradiation treatment on the mask. In one embodiment, the irradiation module may include a laser to provide a laser treatment. In another embodiment, the irradiation module may include a UV lamp to provide a UV irradiation treatment. In one example, the irradiation module includes a UV lamp capable of generating UV irradiation with a wavelength ranging between about 157 nm and about 257 nm. In a further example, the irradiation module includes a 172-nm Osram lamp. The irradiation module may further include a chamber to provide a vacuum environment. In another example, the irradiation unit, such as a laser or an UV lamp, is integrated with the vacuum chamber. For example, a laser or a UV lamp is built in the vacuum chamber for the irradiation treatment in a vacuum environment. In another embodiment, a gas injection unit is integrated into the irradiation module to perform the irradiation treatment with gas injection provided to the substrate in parallel.

The system 60 may additionally include a vacuum module 68. For example, the system 60 includes a vacuum chamber. In another embodiment, the system 300 includes various vacuum devices capable of providing a vacuum environment with a pressure lower than $10^{-3}$ torr. In another embodiment, the vacuum module may be designed and configured to provide a vacuum environment to various modules such as the thermal module 64, and/or the irradiation module 66.

The system 60 includes a chemical dispenser 70 designed and configured such that various chemicals can be dispensed, blended at a predefined ratio, and sent to a cleaning location, a cleaning chamber or other suitable configuration. In this case, the cleaning chamber may be also integrated with the chemical dispenser or combined with other proper modules. In one example, the chemical dispenser 70 is designed to controllably dispense the first and second cleaning fluids. For example, the chemical dispenser 70 includes a first unit and a second unit designed and configured to provide the first and second cleaning fluids, respectively.

The system 60 may further include an auto-transfer 72 such as a robotic hand to automatically transfer a work piece (the substrate 40) among the various module. In one example, a mask in a pod is automatically transferred to the thermal module. The system 60 may further include other proper modules integral to various components of the system 60. For example, the system 60 includes an ultrasonic source to provide ultrasonic energy to the substrate. In another example, the ultrasonic source is applied to a cleaning fluid (such as the first and second cleaning fluids) to enhance the cleaning effect of the respective cleaning fluid. The ultrasonic source provides ultrasonic energy with various frequencies and an adjustable power level. For example, the ultrasonic source may provide an ultrasonic power having a frequency of about 360 KHz and/or a megasonic power having a frequency of about 1 MHz. The ultrasonic power is generated thereby and transferred to a cleaning fluid such as the first cleaning fluid. The system 60 may include other components such as a power supply, electrical control, operator interface, and/or a cleaning chamber configured to implement the method 10 for effective cleaning the substrate 40.

The present disclosure provides a method and a system to clean the substrate to reduce chemical contaminants. Various embodiments, alternatives and extensions may be additionally or alternatively implemented according to aspects of the disclosure without departure from the spirit and scope thereof. For example, more than one mask (or wafer) may be processed in a batch by the method 10, with proper configurations for batch cleaning. In the method 10, various steps can be implemented in parallel to respective substrates, to effectively reduce the cleaning duration and increase the throughput. In the system 60, each module can be combined with, distributed in, embedded in and/or integrated with other modules or an additional subsystem in various configurations such that the method 10 can be implemented more efficiently. For example, a special ultrasonic wavelength scan unit is embedded in a vacuum chamber to provide higher efficiency of breaking chemical bonds between the substrate and the contaminants. In another example, a special hot baking unit is embedded in a vacuum chamber to provide better residue outgassing efficiency. In some embodiments, the method 10 is implemented at various fabrication stages such as after a photoresist layer is stripped, or cleaned.

Assuming the substrate 40 is a mask for illustration In the following examples. In one example, the method 10 is implemented after a mask final cleaning step and before a pellicle is mounted. In another embodiment, the system 60 is integrated with other mask making tools such as photolithography tools, deposition tools, etching tools, and/or e-beam tools for fabrication efficiency and reduced contamination sources. The mask thus cleaned may be further inspected for any remaining contamination and/or damage. The method 10 may be repeated if necessary.

Based on the above, the present disclosure presents a method and a system that employs a cleaning fluid with a protection function. When the cleaning fluid is applied to the substrate, it simultaneously cleans the substrate and forms a protection layer on the substrate. The cleaning fluid includes a cleaning chemical, a protection additive and a solvent. The method further includes a removing process to subsequently remove the protection layer.

Various embodiments of the method 10, the system 60 and the substrate 40 are described according to various aspects of the present disclosure. Other alternatives and modifications may present without departure from the spirit of the present disclosure. Various advantages may present in different embodiments of the present disclosure. In one example, the method 10 is capable of effectively clean the substrate without damaging the substrate.

Thus, the present disclosure provides a cleaning method in accordance with some embodiments. The method includes applying a first cleaning fluid to a substrate, thereby cleaning the substrate and forming a protection layer on the substrate; and applying a removing process to the substrate, thereby removing the protection layer from the substrate. The first cleaning fluid includes a cleaning chemical, a protection additive and a solvent.

The present disclosure provides a method in accordance with some other embodiments. The method includes applying a first cleaning fluid to a substrate, thereby cleaning the substrate and forming a protection layer on the substrate, wherein the first cleaning fluid includes a cleaning chemical, a protection additive and a solvent; and applying a second cleaning fluid to the substrate, thereby removing the protection layer from the substrate, wherein the second cleaning fluid includes isopropyl alcohol (IPA), Hexane, and N-Methylpyrrolidone (NMP).

The present disclosure provides a method in accordance with some other embodiments. The method includes applying a first cleaning fluid to a substrate, thereby cleaning the substrate and forming a protection layer on the substrate, wherein the first cleaning fluid includes a cleaning chemical, a protection additive and a solvent, wherein the protection additive includes a linking unit (L), a space unit (R), and protection unit (Z) chemically bonded together; and applying a second cleaning fluid to the substrate, thereby removing the protection layer from the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   applying a first cleaning fluid to a substrate, thereby removing contaminants from the substrate and forming a protection layer on the substrate,
   wherein the first cleaning fluid includes a cleaning chemical, a protection additive and a solvent,
   wherein after applying the first cleaning fluid, the protection additive remains adsorbed to the substrate to form the protection layer, and
   wherein the protection additive includes a linking unit (L), a space unit (R), and protection unit (Z) chemically bonded together; and
   after applying the first cleaning fluid, applying a removing process to the substrate, thereby removing the protection layer from the substrate.

2. The method of claim 1, wherein the applying of the first cleaning fluid to the substrate includes applying the first cleaning fluid to the substrate by a spin-on process.

3. The method of claim 1, wherein the cleaning chemical is designed to remove contaminant from the substrate by chemical force selected from the group consisting of oxidation/reduction reaction, acid/base reaction, substitution and addition reaction.

4. The method of claim 1, wherein the cleaning chemical is designed to remove contaminant from the substrate by physical force selected from the group consisting of columbic force and magnetic force.

5. The method of claim 1, wherein the cleaning chemical includes one selected from the group consisting of $O_3$, surfactant, $CO_2$, organic acid, inorganic acid, organic base, inorganic base, $H_2O_2$, and a combination thereof.

6. The method of claim 1, wherein the solvent includes water and an organic solvent.

7. The method of claim 6, wherein the water in the first cleaning fluid includes a volume concentration greater than 50%.

8. The method of claim 1, wherein the protection additive is designed to be attached to the substrate by chemical force selected from the group consisting of oxidation/reduction reaction, acid/base reaction, substitution and addition reaction.

9. The method of claim 1, wherein the protection additive is designed to be attached to the substrate by physical force selected from the group consisting of columbic force and magnetic force.

10. The method of claim 1, wherein the space unit is bonded with the linking unit from one end and bonded with the protection unit from another end.

11. The method of claim 1, wherein the linking unit L is common lewis base and includes a function group selected from the group consisting of I—, Br—, F—, Cl—, NO3—, S2—, SCN—, OH—, C2O42—, H2O, NCS—, NH3, alkenyl, SO32—, phenol, NO2—, CO, and CN.

12. The method of claim 1, wherein space unit R is selected from the group consisting of a substituted or unsubstitued, straight or branched C1-C20 alkyl, alkenyl or oxoalkyl group or a substituted or unsubstituted C6-C19 aryl, aralkyl or aryloxoaclkyl group, and hydrogen.

13. The method of claim 1, wherein protection group Z is selected from the group consisting of a substituted or unsubstitued, straight or branched C1-C20 alkyl, alkenyl or oxoalkyl group or a substituted or unsubstitued C6-C19 aryl, aralkyl or aryloxoaclkyl group or hydrogen, C1-C15 fluoroalkyl or fluoroalcohol-containing group.

14. The method of claim 1, wherein the applying of the removing process includes applying a treatment process selected from the group consisting of thermal, electric, acoustic, magnetic, and actinic treatment.

15. The method of claim 1, wherein the applying of the removing process includes applying a second cleaning fluid to the substrate, wherein the second cleaning fluid includes a mixture of isopropyl alcohol (IPA), Hexane, and N-Methylpyrrolidone (NMP).

16. The method of claim 1, wherein the applying of the removing process includes applying a second cleaning fluid to the substrate, wherein the second cleaning fluid includes a mixture of IPA and H2O.

17. The method of claim 1, wherein the applying of the removing process includes applying a second cleaning fluid to the substrate, wherein the second cleaning fluid includes a mixture of IPA and NMP.

18. A method, comprising:
applying a first cleaning fluid to a photomask, thereby concurrently cleaning the photomask and forming a protection layer on the photomask, wherein the first cleaning fluid includes a cleaning chemical, a protection additive and a solvent, and wherein after applying the first cleaning fluid, the protection additive remains adsorbed to the photomask to form the protection layer; and
applying a second cleaning fluid to the photomask, thereby removing the protection layer from the photomask, wherein the second cleaning fluid includes an organic solvent, wherein the organic solvent further includes isopropyl alcohol (IPA), Hexane, and N-Methylpyrrolidone (NMP).

19. A method, comprising:
applying a first cleaning fluid to a substrate, thereby removing a photoresist residue from the substrate and forming a protection layer on the substrate, wherein the first cleaning fluid includes a cleaning chemical, a protection additive and a solvent, wherein the protection additive includes a linking unit (L), a space unit (R), and protection unit (Z) chemically bonded together, and wherein after applying the first cleaning fluid, the protection additive remains adsorbed to the substrate to form the protection layer; and
after applying the first cleaning fluid, applying a second cleaning fluid to the substrate, thereby removing the protection layer from the substrate.

20. The method of claim 19, wherein the space unit is bonded with the linking unit from one end and bonded with the protection unit from another end.

* * * * *